(12) United States Patent
Dhar et al.

(10) Patent No.: US 9,984,894 B2
(45) Date of Patent: May 29, 2018

(54) FORMING SIC MOSFETS WITH HIGH CHANNEL MOBILITY BY TREATING THE OXIDE INTERFACE WITH CESIUM IONS

(75) Inventors: Sarit Dhar, Raleigh, NC (US); Sei-Hyung Ryu, Cary, NC (US); Anant Agarwal, Chapel Hill, NC (US); John Robert Williams, Opelika, AL (US)

(73) Assignees: Cree, Inc., Durham, NC (US); Auburn University, Auburn, AL (US)

( * ) Notice: Subject to any disclaimer, the term of this patent is extended or adjusted under 35 U.S.C. 154(b) by 75 days.

(21) Appl. No.: 13/196,994

(22) Filed: Aug. 3, 2011

(65) Prior Publication Data

US 2013/0034941 A1 Feb. 7, 2013

(51) Int. Cl.
| | |
|---|---|
| H01L 21/336 | (2006.01) |
| H01L 21/3115 | (2006.01) |
| H01L 21/04 | (2006.01) |
| H01L 29/40 | (2006.01) |
| H01L 29/51 | (2006.01) |
| H01L 29/66 | (2006.01) |
| H01L 29/78 | (2006.01) |
| H01L 29/16 | (2006.01) |
| H01L 29/08 | (2006.01) |

(52) U.S. Cl.
CPC ........ *H01L 21/3115* (2013.01); *H01L 21/049* (2013.01); *H01L 29/408* (2013.01); *H01L 29/51* (2013.01); *H01L 29/66068* (2013.01); *H01L 29/78* (2013.01); *H01L 29/7802* (2013.01); *H01L 29/0878* (2013.01); *H01L 29/1608* (2013.01)

(58) Field of Classification Search
CPC ............... H01L 21/30; H01L 29/66045; H01L 29/66053; H01L 21/3115; H01L 21/049; H01L 29/1608
USPC ................................. 438/197, 770, 775, 923
See application file for complete search history.

(56) References Cited

U.S. PATENT DOCUMENTS

| | | | |
|---|---|---|---|
| 3,924,024 A | 12/1975 | Naber et al. | |
| 4,048,350 A * | 9/1977 | Glang ................. | H01L 29/0638 257/378 |
| 4,069,058 A | 1/1978 | Washburn | |
| 4,466,172 A | 8/1984 | Batra | |
| 4,875,083 A | 10/1989 | Palmour | |
| 4,958,204 A | 9/1990 | Blanchard et al. | |

(Continued)

FOREIGN PATENT DOCUMENTS

| | | |
|---|---|---|
| CN | 1478302 A | 2/2004 |
| CN | 1531744 A | 9/2004 |

(Continued)

OTHER PUBLICATIONS

A.K. Agarwal, J.B. Casady, L.B. Rowland, W.F. Valek, and C.D. Brandt, "1400 V 4H-SiC Power MOSFET's," Materials Science Forum vols. 264-268, pp. 989-992, 1998.

(Continued)

*Primary Examiner* — Khiem D Nguyen
(74) *Attorney, Agent, or Firm* — Myers Bigel, P.A.

(57) ABSTRACT

Methods of forming a semiconductor structure include providing an insulation layer on a semiconductor layer and diffusing cesium ions into the insulation layer from a cesium ion source outside the insulation layer. A MOSFET including an insulation layer treated with cesium ions may exhibit increased inversion layer mobility.

16 Claims, 5 Drawing Sheets

(56) References Cited

U.S. PATENT DOCUMENTS

| | | |
|---|---|---|
| 4,978,631 A | 12/1990 | Blanchard |
| 5,030,600 A | 7/1991 | Hida et al. |
| 5,114,887 A | 5/1992 | Sekine et al. |
| 5,125,984 A * | 6/1992 | Kruehler ............ H01L 31/02168 136/255 |
| 5,170,231 A | 12/1992 | Fujii et al. |
| 5,170,455 A | 12/1992 | Goossen et al. |
| 5,184,199 A | 2/1993 | Fujii et al. |
| 5,479,316 A | 12/1995 | Smrtic et al. |
| 5,506,421 A | 4/1996 | Palmour et al. |
| 5,510,630 A | 4/1996 | Agarwal |
| 5,554,204 A | 9/1996 | Kotaka et al. |
| 5,587,870 A | 12/1996 | Anderson et al. |
| 5,726,463 A | 3/1998 | Brown et al. |
| 5,739,564 A | 4/1998 | Kosa et al. |
| 5,763,905 A | 6/1998 | Harris |
| 5,837,572 A | 11/1998 | Gardner et al. |
| 5,877,045 A | 3/1999 | Kapoor |
| 5,885,870 A | 3/1999 | Maiti et al. |
| 5,939,763 A | 8/1999 | Hao et al. |
| 5,960,289 A | 9/1999 | Tsui et al. |
| 5,972,801 A | 10/1999 | Lipkin et al. |
| 5,986,305 A * | 11/1999 | Wu .................... H01L 29/42376 257/344 |
| 6,025,608 A | 2/2000 | Harris et al. |
| 6,028,012 A | 2/2000 | Wang |
| 6,048,766 A | 4/2000 | Gardner et al. |
| 6,054,352 A | 4/2000 | Ueno |
| 6,063,698 A | 5/2000 | Tseng et al. |
| 6,096,607 A | 8/2000 | Ueno |
| 6,100,169 A | 8/2000 | Suvorov et al. |
| 6,107,142 A | 8/2000 | Suvorov et al. |
| 6,117,735 A | 9/2000 | Ueno |
| 6,136,728 A | 10/2000 | Wang |
| 6,165,822 A | 12/2000 | Okuno et al. |
| 6,171,905 B1 | 1/2001 | Morita et al. |
| 6,190,973 B1 | 2/2001 | Berg et al. |
| 6,204,203 B1 | 3/2001 | Narwanker et al. |
| 6,211,035 B1 | 4/2001 | Moise et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,246,076 B1 | 6/2001 | Lipkin et al. |
| 6,261,976 B1 | 7/2001 | Dong |
| 6,297,172 B1 | 10/2001 | Kashiwagi |
| 6,316,791 B1 | 11/2001 | Schorner et al. |
| 6,342,748 B1 | 1/2002 | Nakamura et al. |
| 6,344,663 B1 | 2/2002 | Slater, Jr. et al. |
| 6,444,542 B2 | 9/2002 | Moise et al. |
| 6,455,892 B1 | 9/2002 | Okuno et al. |
| 6,524,877 B1 | 2/2003 | Nakazawa et al. |
| 6,559,068 B2 | 5/2003 | Alok et al. |
| 6,593,620 B1 | 7/2003 | Hshieh et al. |
| 6,600,138 B2 | 7/2003 | Hauf et al. |
| 6,610,366 B2 | 8/2003 | Lipkin |
| 6,632,747 B2 | 10/2003 | Niimi et al. |
| 6,707,011 B2 | 3/2004 | Tay et al. |
| 6,767,843 B2 | 7/2004 | Lipkin et al. |
| 7,022,378 B2 * | 4/2006 | Das ....................... H01L 21/049 257/E21.063 |
| 7,045,862 B2 | 5/2006 | Anderson et al. |
| 7,067,176 B2 | 6/2006 | Das et al. |
| 7,727,904 B2 | 6/2010 | Das et al. |
| 2002/0068420 A1 | 6/2002 | Goodwin et al. |
| 2002/0102358 A1 | 8/2002 | Das et al. |
| 2002/0172774 A1 | 11/2002 | Lipkin |
| 2003/0143863 A1 | 7/2003 | Chen et al. |
| 2004/0219800 A1 | 11/2004 | Tognetti |
| 2006/0030163 A1 | 2/2006 | Vaartstra |
| 2006/0163673 A1 * | 7/2006 | Anderson ........ H01L 21/823807 257/401 |
| 2008/0164520 A1 * | 7/2008 | Darwish ............. H01L 29/0649 257/334 |
| 2009/0173973 A1 * | 7/2009 | Kimoto ................. H01L 29/512 257/280 |
| 2010/0123140 A1 * | 5/2010 | Lou ....................... H01L 21/049 257/77 |
| 2012/0019284 A1 * | 1/2012 | Mauder et al. ................. 326/49 |

FOREIGN PATENT DOCUMENTS

| | | |
|---|---|---|
| CN | 1606140 A | 4/2005 |
| DE | 198 09 554 | 9/1998 |
| DE | 19900171 | 12/2000 |
| DE | 10036208 | 2/2002 |
| EP | 0 637 069 A1 | 2/1995 |
| EP | 0 637 069 B1 | 1/2001 |
| EP | 1 523 032 | 4/2005 |
| GB | 1 315 923 A | 5/1973 |
| JP | 52-038892 | 3/1977 |
| JP | 64-008633 | 1/1989 |
| JP | 03-157974 | 7/1991 |
| JP | 06-232402 | 8/1994 |
| JP | 7-221038 A | 8/1995 |
| JP | 08-264766 | 10/1996 |
| JP | 09-205202 | 8/1997 |
| JP | 11-191559 | 7/1999 |
| JP | 11-238742 | 8/1999 |
| JP | 11-261061 | 9/1999 |
| JP | 11-266017 | 9/1999 |
| JP | 11-274487 | 10/1999 |
| JP | 2000-049167 | 2/2000 |
| JP | 2000-082812 | 3/2000 |
| JP | 2000-252461 A | 9/2000 |
| JP | 2001-060067 | 3/2001 |
| JP | 2000-106371 | 4/2001 |
| JP | 2005-537677 A | 12/2005 |
| WO | WO 97/17730 | 5/1997 |
| WO | WO 97/39485 | 10/1997 |
| WO | WO 98/02924 | 1/1998 |
| WO | WO 99/63591 | 12/1999 |
| WO | WO 00/13236 | 3/2000 |
| WO | WO 03/003435 | 1/2003 |

OTHER PUBLICATIONS

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum*, vol. 338-342, pp. 1307-1310, 2000.

A.K. Agarwal, S. Seshadri, and L. B. Rowland, "Temperature Dependence of Fowler-Nordheim Current in 6H-and 4H-SiC MOS Capacitors." *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Bhatnagar et al. "Comparison of 6H-SiC, 3C-SiC, and Si for Power Devices" *IEE Transactions on Electron Devices*, vol. 40(3), Mar. 1993.

Chakraborty et al. "Interface Properties of $N_2O$-annealed $SiO_2$/SiC system," *Proceedings IEEE Hong Kong Electron Devices Meeting.* Jun. 24, 2000, pp. 108-111.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc.* vol. 640, 2001.

Cho et al. "Improvement of charge trapping by hydrogen post-oxidation annealing in gate oxide of 4H-SiC Metal-oxide-semiconductor capacitors," *Applied Physics Letters.* vol. 77, No. 8, pp. 1215-1217, (Jun. 27, 2000).

(56) References Cited

OTHER PUBLICATIONS

Chung et al. "The Effect of Si:C Source Ratio on SiO₂/SiC Interface State Density for Nitrogen Doped 4H and 6H-SiC," *Materials Science Forum*. (2000) vols. 338-342, pp. 1097-1100.

Chung et al. "Improved Inversion Channel Mobility for 4H-SiC MOSFETs Following High Temperature Anneals in Nitric Oxide" *IEEE Electron Device Letters* vol. 22(4), Apr. 2001.

Chung et al., "Effects of Anneals in Ammonia on the Interface Trap Density Near the Band Edges in 4H-Silicon Carbide Metal-Oxide-Semiconductor Capacitors", *Applied Physics Letters*, vol. 77, No. 22, Nov. 27, 2000, pp. 3601-3603.

D. Alok, E. Arnold, and R. Egloff, "Process Dependence of Inversion Layer Mobility in 4H-SiC Devices," 99 *Materials Science Forum*, vols. 338-342, pp. 1077-1080, 2000.

De Meo et al., "Thermal Oxidation of SiC in $N_2O$", *J. Electrochem, Soc.*, vol. 141, 1994, pp. L150-L152.

del Prado et al. "Full Composition Range Silicon Oxynitride Films Deposited by ECR-PECVD at Room Temperatures," *Thin Solid Films*. vol. 343-344 (1999) p. 437-440.

Dimitrijev et al., "Nitridation of Silicon-Dioxide Films Grown on 6H Silicon Carbide", *IEEE Electronic Device Letters*, vol. 18, No. 5, May 5, 1997, pp. 175-177.

Fukuda et al. "Improvement of $SiO_2$/4H-SiC Interface Using High-Temperature Hydrogen Annealing at Low Pressure and Vacuum Annealing," *Jpn J. Appl. Phys*. vol. 38, Apr. 1999, pp. 2306-2309.

Fukuda et al. "Improvement of $SiO_2$/4H-SiC Interface by Using High Temperature Hydrogen Annealing at 1000° C.," *Extended Abstracts of the International Conference on Solid State Devices and Materials*, Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in 4H." *Applied Physics Letters*, vol. 76, No. 13, pp. 1713-1715, Mar. 2000.

H.F. Li, S. Dimitrijev, H.B. Harrison, D. Sweatman, and P.T. Tanner. "Improving $SiO_2$ Grown on P-Type 4H-SiC by NO Annealing." *Materials Science Forum*. vols. 264-268 (1998) pp. 869-872.

International Preliminary Examination Report dated Aug. 4, 2003 for corresponding PCT application No. PCT/US02/11691.

International Search Report and Written Opinion for PCT/US2006/035285; dated Jan. 22, 2007.

International Search Report for PCT/US01/30715, dated Jun. 5, 2002.

International Search Report for PCT/US02/09393, dated Oct. 15, 2003.

International Search Report for PCT/US02/11691, dated Dec. 17, 2002.

International Search Report, PCT/US 01/42414, dated Apr. 23, 2002.

J. Tan, J.A. Cooper, Jr., and Mr.R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

J.P. Xu, P.T. Lai, C.L. Chan, B. Li, and Y.C. Cheng, "Improved Performance and Reliability of $N_2O$-Grown Oxynitride on 6H-SiC," *IEEE Electron Device Letters*, vol. 21, No. 6, pp. 298-300, Jun. 2000.

Jamet, et al. "Physical properties of $N_2O$ and NO-nitrided gate oxides grown on 4H SiC," *Applied Physics Letters*. vol. 79, No. 3, Jul. 16, 2001, pp. 323-325.

K. Ueno and Tadaaki Oikawa, "Counter-Doped MOSFET's of 4H-SiC." *IEEE Electron Device Letters*, vol. 20, No. 12, pp. 624-626, Dec. 1999.

K. Ueno, R. Asai, and T. Tsuji. "4H-SiC MOSFET's Utilizing the $H_2$ Surface Cleaning Technique." *IEEE Electron Device Letters*, vol. 19, No. 7, Jul. 1998, pp. 244-246.

Kobayashi et al. "Dielectric Breakdown and Current Conduction of Oxide/Nitride/Oxide Multi-Layer Structures," *1990 IEEE Symposium on VLSI Technology*. pp. 119-120.

L.A. Lipkin and J.W. Palmour, "Low interface state density oxides on p-type SiC," Materials Science Forum vols. 264-268, pp. 853-856, 1998.

Lai et al. "Interface Properties of $N_2O$-Annealed $NH_3$-Treated 6H-SiC MOS Capacitor," *Electron Devices Meeting*, Jun. 26, 1999, pp. 46-49.

Leonhard et al. "Long term stability of gate-oxides on n- and p-type silicon carbide studied by charge injection techniques," *Materials Science Engineering*, vol. 46, No. 1-3, Apr. 1997, pp. 263-266.

Lipkin et al. "Insulator Investigation on SiC for Improved Reliability," *IEEE Transactions on Electron Devices*. vol. 46, No. 3, Mar. 1999, pp. 525-532.

Lipkin et al. "Challenges and State-of-the-Art Oxides in SiC," *Mat. Res. Soc. Symp. Proc.* vol. 640, Nov. 2000, pp. 27-29.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.A. Capano, S.Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Ma et al. "Fixed and trapped charges at oxide-nitride-oxide heterostructure interfaces formed by remote plasma enhanced chemical vapor deposition," *J. Vac. Sci, Technol. B.* vol. 11, No. 4, Jul./Aug. 1993, pp. 1533-1540.

Matin et al. "A Self-Aligned Process for High-Voltage, Short-Channel Vertical DMOSFETs in 4H-SiC" *IEEE Transactions on Electron Devices* 51(10):1721-1725 (2004).

McDonald, K. et al., "Comparison of nitrogen incorporation in $SiO_2$/SiC and $SiO_2$/Si structures", *Applied Physics letters*, 76:5, pp. 568-570 (Jan. 31, 2000).

Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.

P. J. Tobin, Y. Okada, S. A. Ajuria, V. Lakhotia, W. A Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811-1817.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

P.T. Lai, Supratic Chakraborty, C.L. Chan, and Y.C. Cheng, "Effects of nitridation and annealing on interface properties of thermally oxidized $SiO_2$/SiC metal-oxide-semiconductor system," *Applied Physics Letters*, vol. 76, No. 25, pp. 3744-3746, Jun. 2000.

Pantelides et al. "Atomic-Scale Engineering of the $SiC$—$SiO_2$ Interface," *Materials Science Forum*. (2000) vols. 338-342, pp. 1133-1136.

R. Schorner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

R. Schorner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

Ryu et al. "Design and Process Issues for Silicon Carbide Power DiMOSFETS" *Mat. Res. Soc. Symp*. 640:H4.5.1-H4.5.6 (2001).

(56) References Cited

OTHER PUBLICATIONS

Ryu et al., Article and Presentation: "27 mΩ-cm$^2$, 1.6 kV Power DiMOSFETs in 4H-SiC," *Proceedings of the 14 International Symposium on Power Semiconductor Devices & ICs 2002*, Jun. 4-7, 2002, Santa Fe, NM.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Suzuki et al. "Effect of Post-oxidation-annealing in Hydrogen on SiO$_2$/4H-SiC Interface," *Materials Science Forum*, vols. 338-342 (2000) 1073-6.

Sze, S.M. *Physics of Semiconductor Devices*, John Wiley & Sons, p. 383-390, (1981).

V. R. Vathulya, H. Shang, and M. H. White, "A Novel 6H-SiC Power DMOSFET with Implanted P-Well Spacer." *IEEE Electron Device Letters*, vol. 20, No. 7, Jul. 1999, pp. 354-356.

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.V. Afanas'ev, M. Bassler, G. Pensl, and M. Schulz, "Intrinsic SiC/SiO$_2$ Interface States," *Phy. Stat. Sol.* (a), vol. 162, pp. 321-337, 1997.

Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.

Wang et al. "The Effects of NH$_3$ Plasma Passivation on Polysilicon Thin-Film Transistors," *IEEE Electron Device Letters*, vol. 16, No. 11, Nov. 1995, pp. 503-505.

Williams et al., "Passivation of the 4-H SiC/SiO$_2$ Interface with Nitric Oxide", *Materials Science Forum*, vols. 389-393, 2002, pp. 967-972.

Y. Wang, C. Weitzel, and M. Bhatnagar, "Accumulation-Mode SiC Power MOSFET Design Issues," *Materials Science Forum*, vols. 338-342, pp. 1287-1290, (2000).

Yano et al. "High Temperature NO Annealing of Deposited SiO$_2$ and SiON Films on N-type 4H-SiC" *Materials Science Forum* 483-485:685-688 (2005).

Etacude, "Solubility of cesium chloride in gram per 100 g H2O versus temperature", retrieved from the internet on Aug. 22, 2012: (Aug. 22, 2012) http://chemicals.etacude.com/c/more/cscl.html.

International Search Report Corresponding to International Application No. PCT/US2012/043699; dated Sep. 21, 2012; 9 Pages, (Sep. 21, 2012).

Das, Mrinal K. Graduate thesis entitled, *Fundamental Studies of the Silicon Carbide MOS Structure*. Purdue University, (Dec. 1999).

E.O. Sveinbjornsson et al., Sodium Enhanced Oxidation of Si-face 4H-SiC: A Method to Remove Near Interface Traps, Mater. Sci. Forum, vol. 556-557, pp. 287-492 (2007).

Y. Wang et al., "Optimization of 4H-SiC MOS Properties with Cesium Implantation," Mater. Sci. Forum, vol. 600-603, pp. 751-754 (2009).

European Search Report for corresponding to EP Application No. 123820668.7 PCT/US2012/0433699, dated, Feb. 12, 2015, 6 pages.

Japanese Office Action Corresponding to Japanese Application No. 2014-523931; Date of Issuance: Mar. 11, 2015; 4 Pages, Foreign Text Only.

\* cited by examiner

FORMING SIC MOSFETS WITH HIGH CHANNEL MOBILITY BY TREATING THE OXIDE INTERFACE WITH CESIUM IONS

FIELD OF THE INVENTION

This invention relates to methods of fabricating power devices and the resulting devices, and more particularly to silicon carbide power devices and methods of fabricating silicon carbide power devices.

BACKGROUND

Power semiconductor devices are widely used to carry large currents and support high voltages. Modern power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure. In a lateral structure, the drain, gate and source terminals are on the same surface of a substrate. In contrast, in a vertical structure, the source and drain are on opposite surfaces of the substrate.

One widely used silicon power MOSFET is the double diffused MOSFET (DMOSFET) which is fabricated using a double-diffusion process. In these devices, a p-base region and an n+ source region are diffused through a common opening in a mask. The p-base region is driven in deeper than the n+ source. The difference in the lateral diffusion between the p-base and n+ source regions forms a surface channel region.

Recent development efforts in power devices have also included investigation of the use of silicon carbide (SiC) devices for power devices. Silicon carbide (SiC) has a combination of electrical and physical properties that make it attractive for a semiconductor material for high temperature, high voltage, high frequency and high power electronic devices. These properties include a 3.0 eV bandgap, a 4 MV/cm electric field breakdown, a 4.9 W/cm-K thermal conductivity, and a $2.0 \times 10^7$ cm/s electron drift velocity.

Consequently, these properties may allow silicon carbide power devices to operate at higher temperatures, higher power levels and/or with lower specific on-resistance than conventional silicon-based power devices. A theoretical analysis of the superiority of silicon carbide devices over silicon devices is found in a publication by Bhatnagar et al. entitled "Comparison of 6H—SiC, 3C—SiC and Si for Power Devices", IEEE Transactions on Electron Devices, Vol. 40, 1993, pp. 645-655. A power MOSFET fabricated in silicon carbide is described in U.S. Pat. No. 5,506,421 to Palmour entitled "Power MOSFET in Silicon Carbide" and assigned to the assignee of the present invention.

4H—SiC Power DMOSFETs have the potential to offer significant advantages over conventional high voltage Si power switches. Unfortunately, however, it may be difficult to grow an acceptable gate oxide for these devices. Much effort has been focused on reducing the interface trap density ($D_{IT}$) at the SiC/SiO$_2$ interface in order to increase the channel mobility ($\mu_{CH}$) of the devices. Nitric Oxide (NO) anneals at 1175° C. have increased the $\mu_{CH}$ from single digits to ~30 cm$^2$/Vs. See, e.g., G. Y. Chung, et al., *IEEE Electron Dev. Let.* 22, 176 (2001). Researchers have demonstrated even higher channel mobility (~150 cm$^2$/Vs) by oxidizing in an environment containing metallic impurities. See, e.g., U.S. Pat. No. 6,559,068. However, such a process may result in significant oxide contamination, may provide an uncontrolled oxidation rate ($t_{ox}$>1500 Å), and/or may be incompatible with high temperature processing steps such as may be used for ohmic contact anneals.

SUMMARY

Methods of forming a semiconductor structure according to some embodiments include providing an insulation layer on a semiconductor layer, and diffusing cesium ions into the insulation layer from a cesium ion source outside the insulation layer.

Diffusing cesium ions into the insulation layer may include diffusing cesium ions to an interface between the insulation layer and the semiconductor layer.

The methods may further include depositing a cesium ion source on the insulation layer before diffusing cesium ions into the insulation layer. Depositing the cesium ion source may include boiling the insulation layer in a CsCl solution. In particular embodiments, boiling the insulation layer in a CsCl solution may include boiling the insulation layer in a 0.01 M to 1 M aqueous CsCl solution for 1 to 60 minutes at a temperature of about 90 to 100° C.

The methods may further include nitridating the insulation layer. Nitridating the insulation layer may include forming the insulation layer and/or annealing the insulation layer in an environment containing nitrogen.

Diffusing cesium ions into the insulation layer may include annealing the insulation layer at a temperature in excess of about 700° C. In particular, diffusing cesium ions into the insulation layer may include annealing the insulation layer at a temperature between about 700° C. and about 1000° C.

Providing the insulation layer may include thermally oxidizing the semiconductor layer. In other embodiments, providing the insulation layer may include depositing the insulation layer on the semiconductor layer.

The semiconductor layer may include silicon carbide and the insulation layer may include silicon dioxide.

Methods of forming a field effect transistor device according to some embodiments include providing a semiconductor layer, forming spaced apart source and drain regions in the semiconductor layer, the source and drain regions defining a channel region in the semiconductor layer, providing an insulation layer on the semiconductor layer over the channel region, diffusing cesium ions into the insulation layer, forming a gate electrode on the insulation layer, and forming a source contact on the source region.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
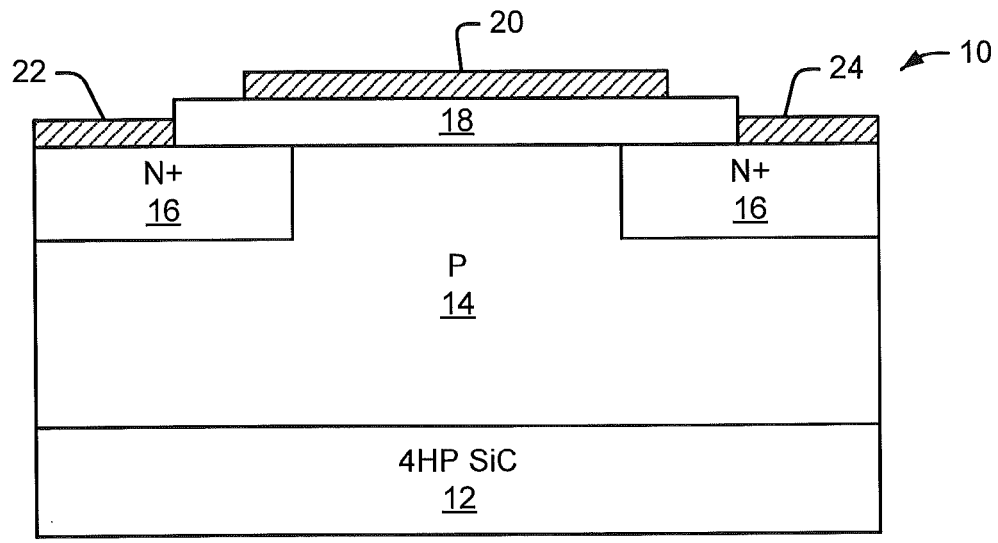
FIG. 1 is a cross sectional illustration of a lateral MOSFET according to some embodiments of the invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

As used herein, the term "and/or" includes any and all combinations of one or more of the associated listed items. It will be understood that, although the terms first, second, third etc. may be used herein to describe various elements, components, regions, materials, layers and/or sections, these elements, components, regions, layers and/or sections should not be limited by these terms. These terms are only used to distinguish one element, component, region, layer, material or section from another element, component, region, layer, material or section. Thus, a first element, component, region, layer, material or section discussed below could be termed a second element, component, region, layer, material or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As noted above, one factor limiting the development of high voltage SiC MOSFET devices has been the problem of interface traps along the $SiC/SiO_2$ interface. The problem of interface traps is not limited to $SiC/SiO_2$ interfaces, however. Interface traps can reduce mobility in MOSFETs formed in other types of material systems, such as MOSFETs formed in polysilicon, amorphous silicon, gallium nitride, etc.

Metal enhanced oxidation, such as disclosed in commonly assigned U.S. Pat. No. 7,727,904, issued Jun. 1, 2010, entitled *Methods of Forming SIC Mosfets with High Inversion Layer Mobility*, the disclosure of which is incorporated herein by reference, has proven to reduce the density of interface traps, resulting in increased channel mobility.

More recently, the incorporation of sodium into a $SiC/SiO_2$ interface by deliberate contamination of the oxide layer during formation has been investigated and found to reduce interface traps, as discussed in E. O. Sveinbjornsson, et al., Sodium Enhanced Oxidation of Si-face 4H-SiC: a Method to Remove Near Interface Traps, Mater. Sci. Forum, Vol. 556-557, pp. 487-492 (2007). However, sodium is highly mobile in $SiO_2$, which may result in temperature instability in MOSFET devices. In particular, sodium may cause gate instability in devices at operating temperatures of 100° C. to 200° C.

The incorporation of Cesium into $SiC/SiO_2$ interfaces by implantation of Cs+ ions into deposited oxides has been investigated and found to decrease the density of interface traps, as described in Y. Wang et al., Optimization of 4H-SiC MOS Properties with Cesium Implantation, Mater. Sci. Forum, Vol. 600-603, p.p. 751-754 (2009). Cesium is less mobile than sodium in $SiO_2$. However, implantation of Cs+ ions may induce implantation damage in the oxide layer, which may be undesirable for a MOSFET gate oxide. It is noted that Wang is directed to MOS capacitors. The lattice damage caused by implantation of Cs+ ions may adversely affect the mobility of carriers beneath the oxide, thus potentially rendering such processes unsuitable for MOSFET devices. Implantation of Cs+ ions may also render the oxide unreliable due to implant damage in the oxide.

Embodiments of the invention provide MOS devices, including MOSFET devices, having enhanced oxide/semiconductor interfaces. In particular, an oxide/semiconductor interface may be enhanced by diffusing Cs+ ions to the interface after formation of the oxide layer. The resulting devices may demonstrate high inversion layer mobility, which may make them suitable for power MOSFET fabrication. In particular embodiments, the resulting devices may include 4H-SiC power MOSFETs and/or MOSFETs formed using other materials, such as polysilicon, amorphous silicon, gallium nitride, etc. Furthermore, as Cs+ ions are relatively immobile, the use of Cs+ ions to treat the oxide/semiconductor interface may offer advantages compared to the incorporation of sodium ions.

In particular, in some embodiments, a gate oxide is treated with an aqueous CsCl solution, after which a high temperature diffusion is performed which results in the diffusion of Cs+ ions form the oxide surface through the oxide and to the gate insulator/semiconductor interface. The positively charged CS ions may offset negatively charged traps at the gate insulator/semiconductor interface, which may result in improved channel mobility. As Cs+ ions are relatively immobile in insulators, such as $SiO_2$, compared, for example, to sodium ions, the gate voltage of a device treated with Cs+ ions may be more stable at operation temperatures. Moreover, incorporation of Cs+ ions by diffusion may avoid implant damage that can occur during implantation of Cs+ ions.

Embodiments of the invention may increase channel mobility of a 4H-SiC device from about 20 $cm^2/V$-s to about 100 $cm^2/V$-s.

Referring now to FIG. 1, embodiments of a lateral MOSFET according to some embodiments of the invention are illustrated.

As illustrated in FIG. 1, an N-channel lateral MOSFET 10 includes a p-type epitaxial layer 14 grown on a substrate 12, which may be an 8° off-axis (0001) conducting 4H p-type SiC crystal. Other polytypes and/or off-axis angles of silicon carbide may also be used for the substrate 12. In other embodiments, the substrate 12 may include a material, such as polysilicon, amorphous silicon, and/or gallium nitride.

In some embodiments, the epitaxial layer 14 may have a thickness of about 5 μm or more and may be formed using, for example, an MOCVD process, and may be doped with p-type impurities such as boron and/or aluminum at a concentration of about $5 \times 10^{15} - 1 \times 10^{16}$ $cm^{-3}$. The epitaxial layer 14 may have a thickness less than 5 μm in some cases. In particular embodiments, the epitaxial layer 14 may have a thickness of about 5 μm and may have a dopant concentration of about $5 \times 10^{15}$ $cm^{-3}$. In some embodiments, the channel region of the epitaxial layer 14 may be doped via ion implantation and may have a dopant concentration of about $1 \times 10^{16}$ $cm^{-3}$ to $1 \times 10^{19}$ $cm^{-3}$.

Nitrogen and/or phosphorus ions may be implanted into the epitaxial layer 14 to form n+ source/drain regions 16, such that the n+ source/drain regions have a dopant concentration of about $1 \times 10^{19}$ $cm^{-3}$ or more. However, if the dopant concentration of the source/drain regions 16 is less than $1 \times 10^{20}$, a thermal anneal may be required to form ohmic contacts thereon. In particular embodiments, the n+ source/drain regions 16 may be doped with phosphorus at a dopant concentration of about $1 \times 10^{20}$ $cm^{-3}$. The implants may be activated, for example by a 1650° C. Ar anneal in the presence of Si overpressure. A 0.5 μm thick deposited oxide layer may serve as a field oxide (not shown).

A gate insulation layer 18 is formed on the epitaxial layer 14 between and extending onto the source/drain regions 16. The thickness of the gate insulation layer 18 may depend on the desired operating parameters of the device. For example, it may be appropriate to select an oxide thickness based on a maximum electric field of 3 MV/cm. In particular, the gate insulation layer 18 may have a thickness of about 300 Å.

The gate insulation layer may include $SiO_2$ in some embodiments. However, in other embodiments, the gate insulation layer 18 may include a different insulating material, such as silicon nitride.

The gate insulation layer 18 may be an $SiO_2$ layer that is grown, for example, using a multi-stage oxidation process including an oxidation step in dry $O_2$ followed by re-oxidation (ReOx) in wet $O_2$ as described, for example, in U.S. Pat. No. 5,972,801, the disclosure of which is incorporated herein by reference in its entirety.

The gate insulation layer 18 may be formed, for example, by thermal oxidation of the epitaxial layer 14 for about 3 hours to about 6 hours at a temperature of about 900° C. to about 1300° C. or more. In particular embodiments, the gate insulation layer 18 may be formed, for example, by thermal oxidation of the epitaxial layer 14 for 3.5 hours at a temperature of 1175° C.

In other embodiments, the gate insulation layer 18 may be grown by a dry-wet oxidation process that includes a growth of bulk oxide in dry $O_2$ followed by an anneal of the bulk oxide in wet $O_2$. As used herein, anneal of oxide in wet $O_2$ refers to an anneal of an oxide in an ambient containing both $O_2$ and vaporized $H_2O$. An additional anneal in an inert atmosphere may be performed between the dry oxide growth and the wet oxide anneal. The dry $O_2$ oxide growth may be performed, for example, in a quartz tube at a temperature of up to about 1200° C. in dry $O_2$ for a time of at least about 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used.

In some embodiments, the dry $O_2$ oxide growth may be performed at a temperature of about 1200° C. in dry $O_2$ for about 2.5 hours. The resulting oxide layer may be annealed at a temperature of up to about 1200° C. in an inert atmosphere. In particular, the resulting oxide layer may be annealed at a temperature of about 1175° C. in Ar for about 1 hour. The wet $O_2$ oxide anneal (ReOx) may be performed at a temperature of about 950° C. or less for a time of at least about 1 hour. The temperature of the wet $O_2$ anneal may be limited to discourage further thermal oxide growth at the $SiC/SiO_2$ interface, which may introduce additional interface states. In particular, the wet $O_2$ anneal may be performed in wet $O_2$ at a temperature of about 950° C. for about 3 hours.

In still further embodiments, the gate insulation layer 18 may be deposited rather than thermally grown. For example, the gate oxide may be deposited using a chemical vapor deposition (CVD) process.

Following formation of the gate oxide, the wafer may be boiled in a 0.1M CsCl solution for 10 minutes at a temperature of about 95° C. The CsCl solution may range from a 0.01M CsCl solution to a 1 M CsCl solution. The temperature of the solution may range from room temperature up to 100° C. The wafer may be boiled in the CsCl solution for a time of 1 minute up to 1 hour.] This may result in the absorption and/or deposition of CsCl on the surface of the oxide. The concentration of the CsCl solution may be varied to obtain a desired concentration of Cs at the oxide surface.

Following deposition of CsCl on the surface of the gate insulation layer 18, a diffusion (drive-in) anneal may be performed to cause Cs+ ions to diffuse into the gate insulation layer 18. The diffusion anneal may be performed at a temperature of between 700° C. and 1000° C. to control the amount of Cs+ ions that diffuse to the $SiC/SiO_2$ interface. The diffusion anneal may be performed for a time sufficient to cause a desired concentration of Cs+ ions to diffuse to the $SiC/SiO_2$ interface, and in some embodiments may be performed for about 0.5 hours to about 3 hours. The drive-in temperature and time depends on the gate oxide thickness. In general, thicker oxides are treated at higher temperatures and/or for longer times to achieve the same level of Cs incorporation at the oxide/semiconductor interface. The amount of Cs that is diffused to the interface may be selected based on the amount of fixed charge present or expected to be present at the $SiC/SiO_2$ interface (the interfacial charge). In particular embodiments, a diffusion anneal may be performed at a temperature of 800° C. for 1 hour.

Before or after treating the gate insulator/semiconductor interface with Cs+ ions, the interfacial charge may be reduced, for example, by annealing the gate oxide in NO, $NO_2$, $N_2O$ and/or hydrogen, as described, for example, in commonly assigned U.S. Pat. No. 7,067,176, issued Jun. 27, 2006 entitled Method of Fabricating an Oxide Layer on a Silicon Carbide Layer Utilizing an Anneal in a Hydrogen Environment, U.S. Pat. No. 6,767,843; Issued Jul. 27, 2004, entitled Method of NO Growth of an Oxide Layer on a Silicon Carbide Layer, and U.S. Pat. No. 6,610,366, issued Aug. 26, 2003, entitled Method of NO Annealing an Oxide Layer on a Silicon Carbide Layer, the disclosures of which are incorporated herein by reference.

A gate contact 20 is formed on the gate insulation layer 18. The gate contact 20 may include, for example, molybdenum, boron-doped polysilicon and/or evaporated aluminum. Boron-doped polysilicon may be used to help adjust the threshold voltage of the device to a desired level. Polysilicon doped with other impurities, including n-type impurities, may also be used as a gate contact 20. In some embodiments, the thermal budget of the process may be a concern. In such cases, the use of evaporated aluminum may help reduce the thermal budget. Nickel source/drain contacts 22, 24 may be formed on the source/drain regions 16. In particular, nickel contacts 22, 24 formed on the n+ source/drain regions 16 may exhibit ohmic behavior without any sintering.

Figure 2:
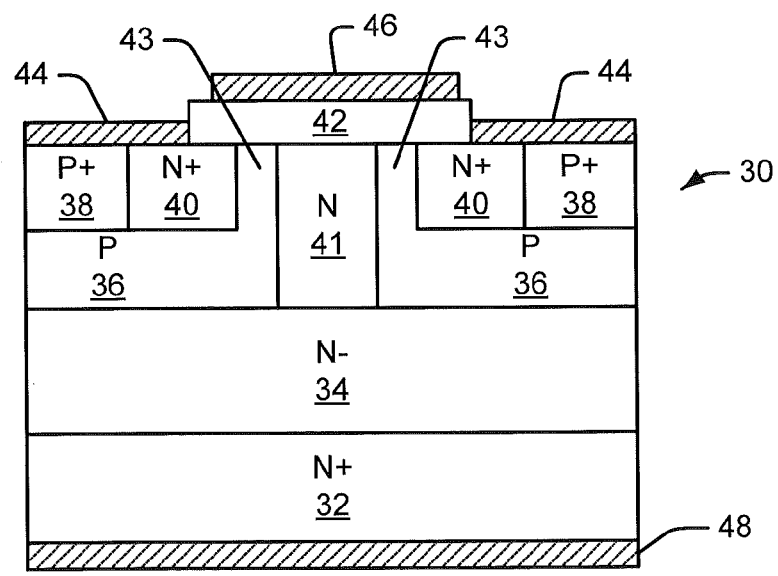
FIG. 2 is a cross sectional illustration of a vertical power MOSFET according to some embodiments of the invention.

Referring now to FIG. 2, a vertical power MOSFET 30 according to some embodiments of the invention is illustrated. Vertical silicon carbide MOSFETs are generally replicated in a unit cell. For ease of illustration, a single unit cell vertical MOSFET will be described.

As is seen in FIG. 2, a MOSFET 30 according to embodiments of the present invention may include an n+ monocrystalline silicon carbide substrate 32. An n-silicon carbide drift layer 34 is provided on a first face of the substrate 32. The doping and thickness of the drift layer 34 may be determined by taking into consideration the desired blocking voltage of the device. For example, for a high voltage device, the drift layer 34 may have a thickness of about 5 µm to about 100 µm and a doping concentration of about $8 \times 10^{15}$ to $1 \times 10^{16}$ cm$^{-3}$. First and second implanted p-type wells 36 are formed in the n-layer 34. The p-wells 36 may be formed using implanted aluminum, resulting in a dopant concentration of $1 \times 10^{17}$ to $1 \times 10^{19}$ cm$^{-3}$. In particular embodiments, the p-wells 36 may have a dopant concentration of about $1 \times 10^{18}$ cm$^{-3}$. Implanted contact regions 38 of p+ silicon carbide may also be provided in the p-wells 36. The implanted contact regions 38 may be formed, for example, by implantation of acceptor ions, such as boron and/or aluminum, to produce regions 38 having a dopant density of about $1 \times 10^{20}$ cm$^{-3}$. In particular, implanted aluminum may be more suitable for the contact regions 38 due to the lower diffusivity of aluminum in SiC.

First and second n+ source regions 40 are provided in the p-type wells 36 adjacent the contact regions 38. The implanted source regions 40 may be formed, for example, by implantation of donor ions to produce regions 40 having a dopant density of about $1 \times 10^{19}$ cm$^{-3}$ or more.

An n-type silicon carbide JFET region 41 is adjacent to the n+ source regions 40. The JFET region 41 is spaced apart from the source regions 40 by channel regions 43 in the p-type wells 36. The JFET region 41, which extends to the n-layer 34, may have a similar dopant concentration as the drift layer 34. In some embodiments, however, the JFET region 41 may be implanted with n-type impurities to have a higher dopant concentration than the drift layer 34. For example, the JFET region 41 may be implanted with donor ions to have a dopant density of from about $1 \times 10^{16}$ to about $1 \times 10^{17}$ cm$^{-3}$. The actual dopant concentration chosen may depend on the desired operational characteristics of the device.

A gate oxide 42 of a suitable dielectric material, such as $SiO_2$, extends over the JFET region 41 and the channel regions 43 to the n+ source regions 40. The gate oxide 42 may have a thickness of from about 250 angstroms to about 1000 angstroms. In particular, the gate oxide 42 may have a thickness of about 300 Å. The gate oxide 42 may be treated with Cs+ ions as described above.

A gate contact 46 is provided on the gate oxide 42 opposite the channel region 43. Source contacts 44 are formed on the n+ source regions 40. The source contacts 44 are also formed on the p+ contact regions 38 to short the n+ source regions to the p-well regions 36. The p-well regions 36 may be relatively highly doped to reduce and/or prevent turning on the parasitic npn transistors formed by source regions 40, well regions 36 and drift layer 34. For example, the p-well regions 36 may have a dopant concentration of about $1 \times 10^{15}$ cm$^{-3}$ to about $1 \times 10^{18}$ cm$^{-3}$ or greater. A drain contact 48 is provided on the face of the substrate 32 opposite the p-type wells 36. The drain contact 48 may be formed, for example, using nickel.

Figure 3A:
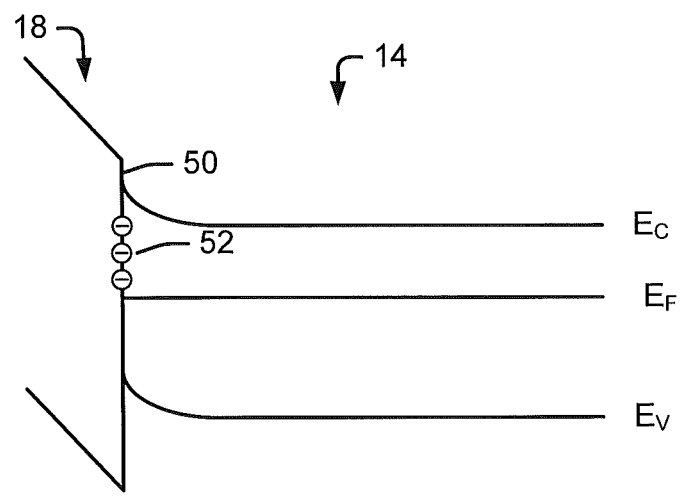
FIGS. 3A and 3B are band diagrams that schematically illustrate the treatment of an oxide/semiconductor interface according to some embodiments of the invention.
Figure 3B:
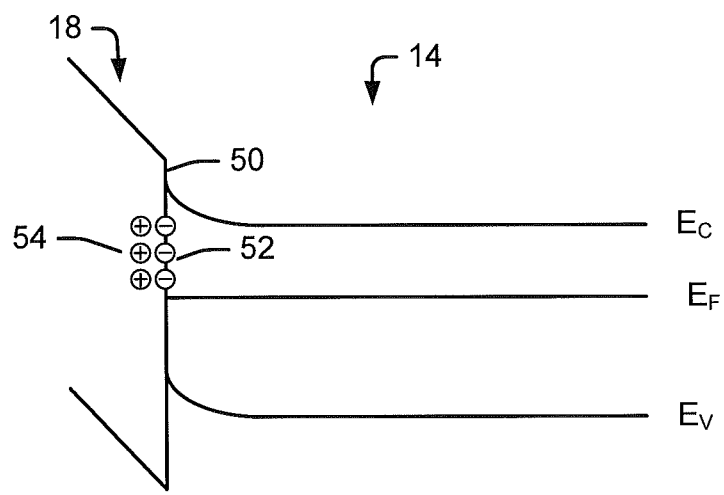

FIGS. 3A and 3B are band diagrams that schematically illustrate the treatment of an oxide/semiconductor interface according to some embodiments of the invention. Referring to FIG. 3A, a plurality of fixed negative charges 52 are present at an interface 50 between a silicon carbide layer 14 and an $SiO_2$ layer 18. Referring to FIG. 3B, after treatment of the $SiC/SiO_2$ interface 50 with Cs+ ions as described above, a plurality of Cs+ ions are present in the oxide layer 18 near the interface 50. The Cs+ ions 54 terminate field lines extending from the fixed negative charges 52, thereby decreasing the impact of the fixed negative charges on mobile charge carriers in an inversion layer formed in the silicon carbide layer 14.

Figure 4:
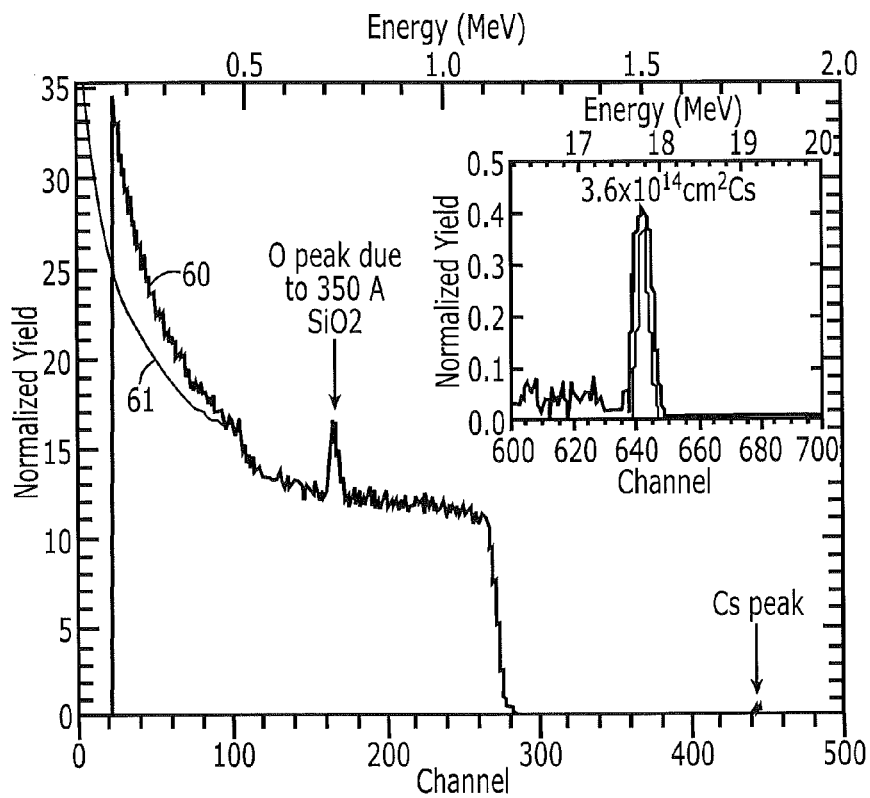
FIG. 4 is a graph of a Rutherford backscattering spectrum of a $SiC/SiO_2$ sample treated in accordance with some embodiments.

FIG. 4 is a graph of a Rutherford backscattering spectrum (RBS) signal 60 of a SiC/SiO2 sample treated in accordance with some embodiments. A simulated RBS signal 61 is also shown. The sample analyzed in the graph of FIG. 4 was formed by diffusing Cs+ ions into a silicon dioxide layer of 350 Å thickness at a temperature of 800° C. for 0.5 hours. The inset shows the Cs+ peak. The RBS analysis shows that a total amount of about $3.6 \times 10^{14}$ cm$^{-2}$ Cs atoms were incorporated in the oxide. It is believed that some fraction of these Cs atoms were positively charged ions. The lower x-axis in the graph of FIG. 4 is the energy channel number (which has no units) but can be converted to energy (upper x-axis). The energy a peak contains depends on the atomic mass of the element and its depth in the sample. In this case, the O surface peak appears at a lower energy than the Cs peak as oxygen is lighter than cesium. The area under the peak corresponds to the amount of the element in the sample.

Figure 5:
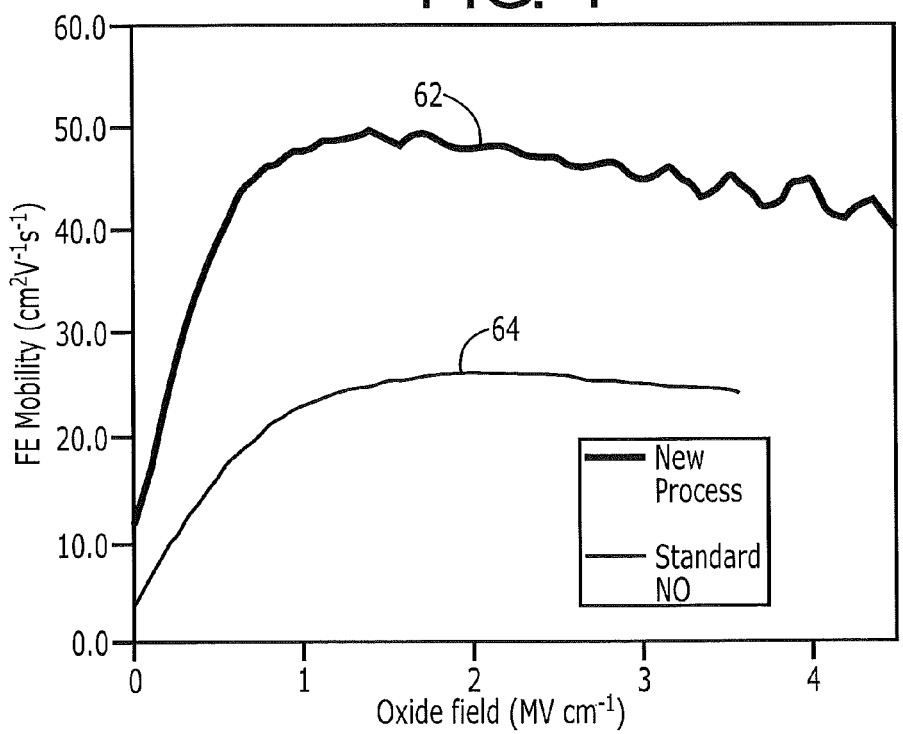
FIG. 5 is a graph of channel mobility versus gate voltage measured at room temperature for lateral MOSFET devices formed in accordance with some embodiments of the invention as well as MOSFET devices formed in accordance with conventional techniques.

FIG. 5 is a graph 62 of channel mobility versus gate voltage measured at room temperature for a lateral MOSFET device formed in accordance with some embodiments of the invention as well as a graph 64 of channel mobility versus gate voltage for a MOSFET device formed in accordance with conventional techniques using an NO anneal. At a typical operating field of 3 MV/cm, the mobility of a device formed in the manner described herein is about twice as much as the conventional device. In particular, a device formed according to some embodiments may exhibit a channel mobility in excess of 40 cm$^2$V-s at an applied electric field of 3 MV/cm.

Figure 6:
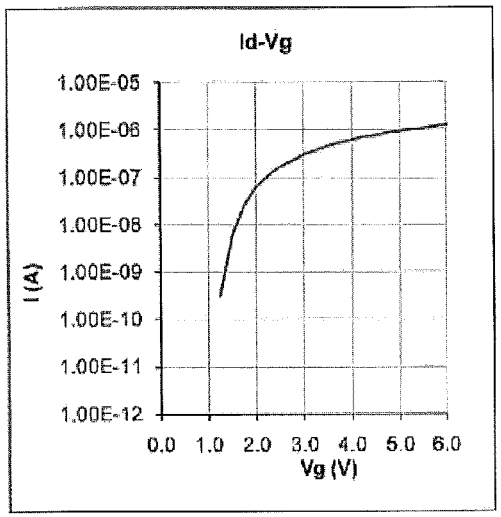
FIG. 6 is a graph of current-voltage transfer characteristics of a MOSFET device formed in accordance with some embodiments of the invention.

FIG. 6 is a graph of current-voltage transfer characteristics of a MOSFET device formed in accordance with some embodiments of the invention. Higher mobility typically results in lower threshold voltages, tending toward normally-off behavior of MOSFET devices, which may be undesirable. However, as shown in FIG. 6, a device formed in accordance with some embodiments of the invention may have a positive threshold voltage.

Figure 7:
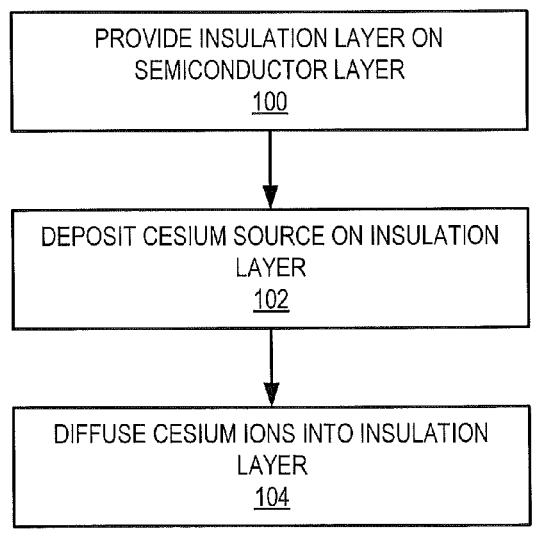
FIGS. 7 and 8 are flowcharts illustrating methods according to some embodiments.

Methods according to some embodiments are illustrated in FIG. 7. As shown therein, in Block 100, an insulation layer is provided on a semiconductor layer. The semiconductor layer may be a silicon carbide layer having a 2H, 4H, 6H, 15R or 3C polytype, an amorphous silicon layer, a polysilicon layer, or a gallium nitride layer. The insulation layer may be an oxide layer that is grown, for example, using a multi-stage oxidation process including an oxidation step in dry $O_2$ followed by re-oxidation (ReOx) in wet $O_2$ as described above. In some embodiments, the oxide layer may be formed by thermal oxidation of the silicon carbide layer. In still further embodiments, the oxide layer may be deposited rather than thermally grown. For example, the oxide layer may be deposited using a chemical vapor deposition (CVD) process.

Following formation of the insulation layer, a cesium diffusion source may be deposited on the oxide layer (Block 102). For example, the semiconductor layer including the insulation layer may be boiled in a 0.1M CsCl solution for 10 minutes at a temperature of about 95° C. to deposit CsCl on the oxide layer.

Finally, cesium ions may be diffused into the insulation layer, and in particular may be diffused to the insulator/semiconductor interface by annealing the semiconductor layer at high temperature (Block 104). In particular, the diffusion anneal may be performed at a temperature of between 700° C. and 1000° C. for about 0.5 hours to about 3 hours. In particular embodiments, a diffusion anneal may be performed at a temperature of 800° C. for 1 hour.

Figure 8:
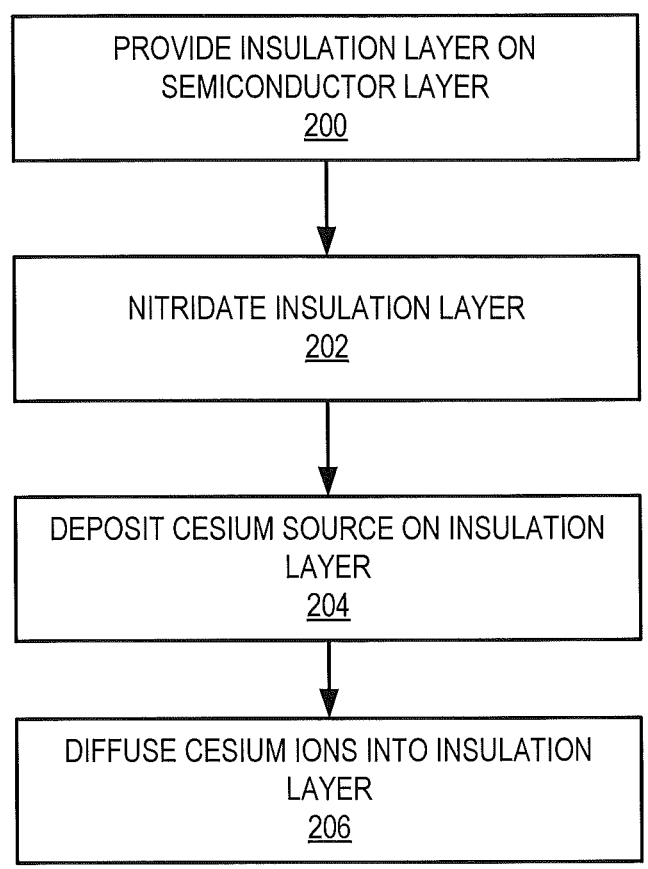

Methods according to further embodiments are illustrated in FIG. 8. As shown therein, in Block 200, an insulation layer is provided on a semiconductor layer. The semiconductor layer may be a silicon carbide layer having a 2H, 4H, 6H, 15R or 3C polytype, an amorphous silicon layer, a polysilicon layer, or a gallium nitride layer. The insulation layer may be an oxide layer that is grown, for example, using a multi-stage oxidation process including an oxidation step in dry $O_2$ followed by re-oxidation (ReOx) in wet $O_2$ as described above. In some embodiments, the insulation layer may be formed by thermal oxidation of the semiconductor layer. In still further embodiments, the oxide layer may be deposited rather than thermally grown. For example, the oxide layer may be deposited using a chemical vapor deposition (CVD) process.

The insulation layer may be nitridated to introduce nitrogen into the oxide layer (Block 202). Nitridation may be performed during or after formation of the insulation layer, and may be performed, for example, by forming the insulation in an environment containing nitrogen and/or annealing the insulation layer in an environment containing nitrogen. For example, the insulation layer may be annealed in an environment containing NO, $NO_2$, and/or $N_2O$, as described, for example, in above-referenced U.S. Pat. Nos. 7,067,176, 6,767,843, and/or 6,610,366.

Following formation of the insulation layer, a cesium diffusion source may be deposited on the insulation layer (Block 204). For example, the semiconductor layer including the insulation layer may be boiled in a 0.1M CsCl solution for 10 minutes at a temperature of about 95° C. to deposit CsCl on the oxide layer.

Finally, cesium ions may be diffused into the insulation layer, and in particular may be diffused to the insulator/semiconductor interface by annealing the semiconductor layer at high temperature (Block 206). In particular, the diffusion anneal may be performed at a temperature of between 700° C. and 1000° C. for about 0.5 hours to about 3 hours. In particular embodiments, a diffusion anneal may be performed at a temperature of 800° C. for 1 hour.

It will be appreciated that nitridation of the insulation layer may be performed before or after diffusion of cesium ions into the insulation layer.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of forming a semiconductor structure, comprising:

providing an insulation layer on a semiconductor layer;

depositing a cesium ion source on the insulation layer; and diffusing cesium ions from the cesium ion source into the insulation layer, wherein diffusing the cesium ions from the cesium ion source into the insulation layer comprises annealing the insulation layer, wherein depositing the cesium ion source on the insulation layer comprises boiling the insulation layer in a CsCl solution, wherein providing the insulation layer on the semiconductor layer comprises forming and/or annealing the insulation layer in an environment containing nitrogen to nitridate the insulation layer and provide a nitridated insulation layer before depositing the cesium ion source on the insulation layer, wherein diffusing the cesium ions from the cesium ion source into the insulation layer comprises diffusing cesium ions into the nitridated insulation layer, and wherein, responsive to diffusing the cesium ions from the cesium ion source into the nitridated insulation layer, the semiconductor structure has a channel mobility of at least 40 cm$^2$/V-s at an applied electric field of 3 MV/cm.

2. The method of claim 1, wherein diffusing the cesium ions into the insulation layer comprises diffusing the cesium ions to an interface between the insulation layer and the semiconductor layer.

3. The method of claim 1, wherein boiling the insulation layer in the CsCl solution comprises boiling the insulation layer in a 0.1 M to 1 M aqueous CsCl solution for 1 minute to 60 minutes at a temperature of about 90° C. to about 100° C.

4. The method of claim 1, wherein annealing the insulation layer comprises annealing the insulation layer at a temperature between about 700° C. and about 1000° C.

5. The method of claim 1, wherein providing the insulation layer comprises thermally oxidizing the semiconductor layer.

6. The method of claim 1, wherein providing the insulation layer comprises depositing the insulation layer on the semiconductor layer.

7. The method of claim 1, wherein the semiconductor layer comprises silicon carbide and the insulation layer comprises silicon dioxide.

8. The method of claim 1, wherein the semiconductor layer comprises polysilicon, amorphous silicon or gallium nitride.

9. The method of claim 1, wherein the nitridated insulation layer has a concentration of cesium ions of at least about $3\times10^{14}$ cm$^{-2}$.

10. A method of forming a field effect transistor device, comprising:
providing a semiconductor layer;
forming spaced apart source and drain regions in the semiconductor layer, the source and drain regions defining a channel region in the semiconductor layer;
providing an insulation layer on the semiconductor layer over the channel region;
depositing a cesium ion source on the insulation layer;
diffusing cesium ions from the cesium ion source into the insulation layer;
forming a gate electrode on the insulation layer; and
forming a contact on the source and drain regions,
wherein diffusing the cesium ions from the cesium ion source into the insulation layer comprises annealing the insulation layer,
wherein depositing the cesium ion source on the insulation layer comprises boiling the insulation layer in a CsCl solution,
wherein providing the insulation layer on the semiconductor layer over the channel region comprises forming and/or annealing the insulation layer in an environment containing nitrogen to nitridate the insulation layer and provide a nitridated insulation layer before depositing the cesium ion source on the insulation layer,
wherein diffusing the cesium ions from the cesium ion source into the insulation layer comprises diffusing cesium ions into the nitridated insulation layer, and
wherein, responsive to diffusing the cesium ions from the cesium ion source into the nitridated insulation layer, the channel region has a channel mobility of at least 40 cm$^2$/V-s at an applied electric field of 3 MV/cm.

11. The method of claim 10, wherein diffusing the cesium ions from the cesium ion source into the insulation layer comprises diffusing the cesium ions to an interface between the insulation layer and the semiconductor layer.

12. The method of claim 10, wherein boiling the insulation layer in the CsCl solution comprises boiling the insulation layer in a 0.1 M aqueous CsCl solution for 10 minutes at a temperature of about 95° C.

13. The method of claim 10, wherein annealing the insulation layer comprises annealing the insulation layer at a temperature between about 700° C. and about 1000° C.

14. The method of claim 10, wherein the semiconductor layer comprises silicon carbide and the insulation layer comprises silicon dioxide.

15. The method of claim 10, wherein the semiconductor layer comprises polysilicon, amorphous silicon or gallium nitride.

16. The method of claim 10, wherein the nitridated insulation layer has a concentration of cesium ions of at least about $3\times10^{14}$ cm$^{-2}$.

* * * * *